April 29, 1952 C. W. LYTLE ET AL 2,594,667

TUNER FOR RADIO AND TELEVISION RECEIVERS AND THE LIKE

Filed Dec. 5, 1949

Inventors:
Chester W. Lytle,
Frank Nienaber,
by [signature] Atty.

Patented Apr. 29, 1952

2,594,667

UNITED STATES PATENT OFFICE 2,594,667

TUNER FOR RADIO AND TELEVISION RECEIVERS AND THE LIKE

Chester W. Lytle and Frank Nienaber, Chicago, Ill., assignors, by mesne assignments, to Lytle Engineering & Mfg. Co., a corporation of Illinois Application December 5, 1949, Serial No. 131,158

13 Claims. (Cl. 74—10.41)

This invention relates to improvements in tuners for radio receivers, and the like. The tuners to which the present improvements relate may be used for tuning reception of signals for television or other intelligence, including F. M. signals, as well as many other kinds of radio signals. Receivers of the general form herein disclosed are also disclosed in the application of Frank Nienaber, Martin Henderson, Emil L. Ranseen, and Chester W. Lytle for improvements in Radio Signal Reception and Tuning, executed by them July 26, 1949. In that other application there is disclosed a form of tuner in which provision is made for tuning to approximate tuning positions by what may be called "index" tuning, together with provision for exact tuning to the selected frequency station after such index tuning has been effected. In that other application provision is made for producing an increased amount of resistance to the tuning movement at the approximate position of each station or channel for which provision has been made in the tuner, so that there is a noticeable arresting tendency produced at each such station or channel, and so that the operator may arrest the tuning movement at such increased movement resistance position for approximate tuning to the selected station or channel without special care. Such increased movement resistance effect is produced by a "click" locking engagement of parts so that a "channel" or "station" tuning engagement is produced with a holding force sufficient to permit further and exact tuning to the exact frequency of the selected station or channel, if needed. But such increased movement resistance is not sufficient to prevent intentional movement of the parts to a further position or positions until the selected station or channel has been reached, at which condition the exact tuning may then be effected.

In the arrangement of that other application there is disclosed an "index" plate having irregularities which will be successively engaged by a spring pressed part, such as a roller, such irregularities preferably comprising notches in the edge of the index plate, and the spring pressed part comprising a spring pressed roller. Also, in that other application such index plate is movable with respect to the element which carries the movable parts of the variable impedances or other tuning members, and the spring pressed roller occupies a substantially fixed position angularly with respect to the frame of the tuner, that is, it is incapable of movement around the axis of the rotary tuning element. Or it may be stated that the rotary tuning element is movable through a limited extent of movement with respect to such index plate. Thus, in that other application the spring pressed engagement of the roller with a notch of the index plate serves to retain the index plate in a semi-locked stationary position corresponding to a selected station or channel, from which semi-locked stationary position the index plate may be disengaged by application of an increased effort by the operator of the device. Furthermore, in that other application the exact tuning is effected by causing a slight movement of the rotary tuning element with respect to the index plate while such index plate is thus retained in such semi-locked position by the spring pressed roller. Provision is made in that other application to effect such slight movement in order to effect exact tuning.

The present application relates to a specific form or embodiment of exact tuning means which incorporates the feature of the index plate together with the irregularities thereon, and the spring pressed roller or other element to engage such irregularities, for semi-locking engagement between these parts at the position of each station or channel to be tuned, together with means to effect exact tuning while such semi-locked engagement is retained. However, in the present embodiment we have made provision for effecting slight movments of the roller about the axis of rotation of the rotary tuning element while such roller is spring pressed into engagement with a selected station or channel notch, and we have provided a definite and generally direct drive connection between the index plate and the rotary tuning element. By this arrangement it is possible to effect approximate tuning to the selected station or channel by engagement of the roller with the proper index plate notch, and to thereafter effect exact tuning movement by slight movement of the spring pressed roller about the axis of rotation of the rotary tuning element while such engagement of the roller with the notch continues. Such slight movement will carry the index plate to the exact tuning position, the rotary tuning element moving with the index plate during such exact tuning movement. The engaging or semi-locking force developed between the roller and the notch of the index plate is sufficient to ensure such exact tuning movement, but is insufficient to prevent intentional disengagement of the roller from the notch when it is desired to move to the position of another station or channel.

It is a further feature and object of the invention to provide a very simple tuning device, and one which can be produced at low cost and according to well understood manufacturing operations.

Other objects and uses of the invention will appear from a detailed description of the same, which consists in the features of construction, and combinations of parts hereinafter described and claimed.

Figure 1:
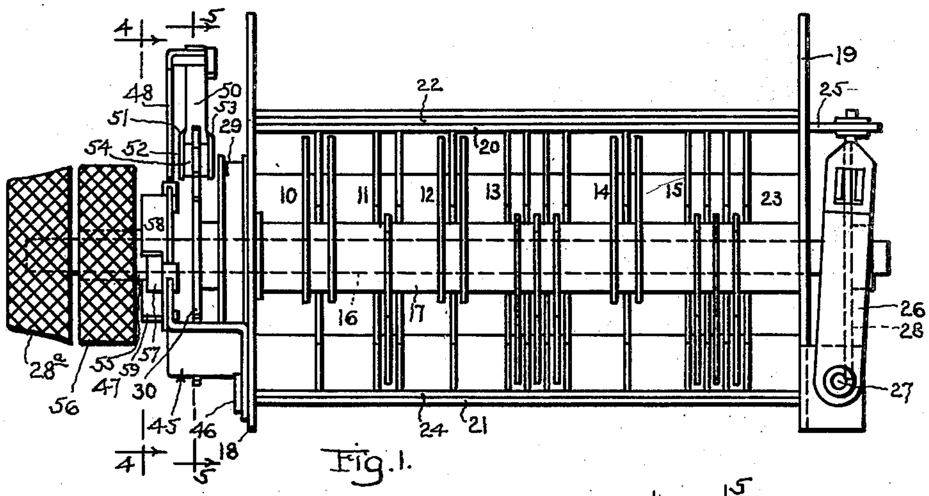
Figure 1 shows a side elevation of a typical tuner embodying the features of the present invention.
Figure 2:
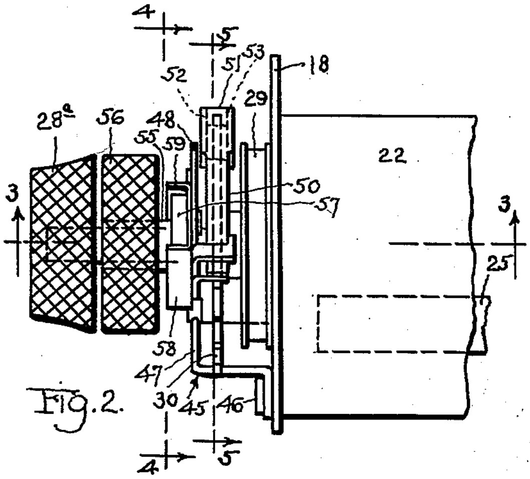
Figure 2 shows a fragmentary plan view of the front end portion of the tuner shown in Figure 1.
Figure 3:
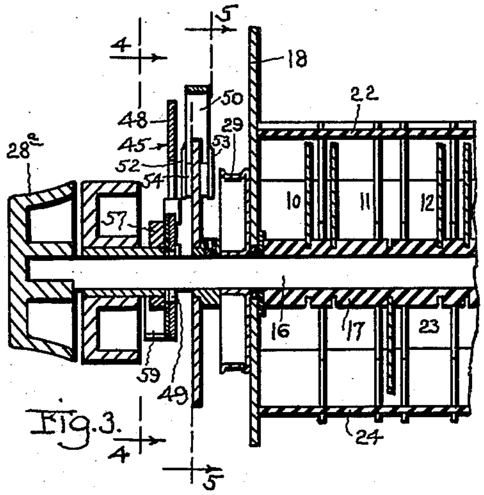
Figure 3 shows a fragmentary longitudinal vertical section through the front portion of the tuner shown in Figures 1 and 2.
Figure 4:
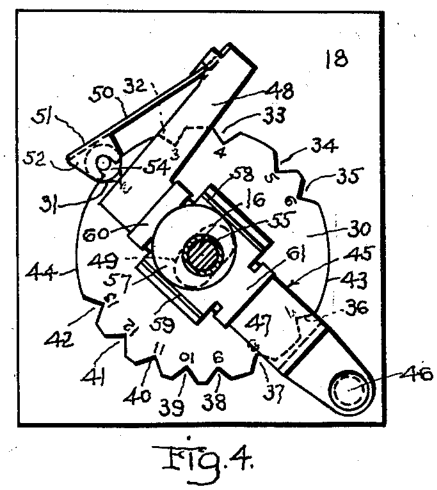
Figure 5:
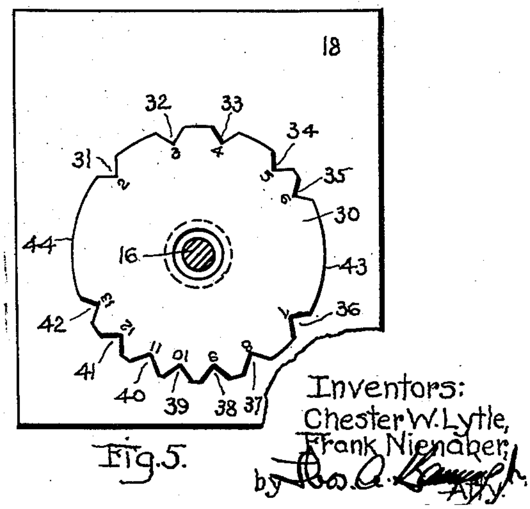

Figure 4 shows a cross-section taken on the line 4—4 of Figures 1, 2 and 3, looking in the directions of the arrows and Figure 5 shows a cross-section taken on the line 5—5 of Figures 1, 2 and 3, looking in the directions of the arrows.

In the drawing we have shown a typical application of the features of our invention to a tuner intended for tuning through two or more bands of frequencies, each band including several channels. The two bands so illustrated are the low and high bands of television frequencies, but evidently other frequency bands might be tuned depending on the circuits with which the tuner is connected and used. Furthermore, the tuner illustrated includes a number of variable impedances which constitute portions of the circuits. These variable impedances include the groups of stators 10, 11, 12, 13, 14 and 15, together with suitable rotor elements which influence these stators in well understood manner. These rotor elements are carried by the shaft 16 or the insulating sleeve 17 mounted thereon. The frame of the tuner includes the front and back end walls 18 and 19, within which the shaft is journalled; and said end walls are rigidly connected together by the frame bars 20 and 21. These frame bars also carry suitable plates 22, 23 and 24 of insulating material. The stator elements are carried by these insulating plates, and suitable terminal and other connections for said stators, including suitable switching means are also carried by the top insulating plate 22. Such switching means, when used, may be controlled by a longitudinally extending slide bar 25 carried by the top insulating plate 22; and provision is made for shifting such slide bar backwardly and forwardly concurrently with rotary movements of the shaft 16 and the rotor elements, so that in passing between the two frequency bands proper changes of connections will be made, as needed. In the arrangement shown such shifting of the slide bar 25 is effected by means of an arm 26 pivoted to a stationary point at the point 27, and a cam plate 28 carried by the rear end of the shaft is provided with suitable cam surfaces to shift the arm 26 in proper timing with respect to the shaft rotations to ensure correct switching changes.

The front end of the shaft 16 carries the hand knob **28*a* by which said shaft may be conveniently rotated for tuning purposes; and a small drum 29** is also shown on the shaft. Over this drum may be wound a number of turns of a cord which connects to a suitable pointer working over an indicating dial or plate to show the station or channel being tuned.

The arrangements thus far described are also shown in such other application (previously referred to herein), and it is deemed unnecessary to make more detailed illustration and description of the same herein.

Secured to the shaft 16, conveniently at a point between the knob **28*a* and the front plate 18, is the index plate 30. This plate is circular, and is provided with a series of irregularities in the form of edge notches 31, 32, 33, 34, 35, 36, 37, 38, 39, 40, 41 and 42. In the form shown these are twelve in number corresponding to the five and the seven presently assigned channels for television reception on the low and high bands, respectively. It is here noted that the five notches 31–35, inclusive are located within one-half circle of the index plate, that is, within 180 degrees of such plate, and correspond to the low television channels, whereas the seven notches 36–42, inclusive are located within the other half circle of the index plate, that is, within the other 180 degrees of such plate, and correspond to the high band television channels. Between the group of notches 31–35 and the group 36–42 there are located the somewhat extensive dwells 43 and 44**, respectively. These are what may be called transition positions, and during passage of these transition positions past a proper location of the frame of the tuner the switching operations are effected.

Evidently rotation of the shaft 16 by turning the knob **28*a* effects rotation of the index plate also. There is a bracket element 45 pivoted to the lower right-hand corner of the front frame plate 18 at the point 46. This bracket element or arm is capable of swing through an amount of movement to effect exact tuning of the tuner under any conditions which may arise in its use. Conveniently this arm is of bell-crank form, or angular, as shown in Figure 4, since this form is found to conform well with the general design of tuner illustrated, but evidently other forms of such arm may be used. This arm therefore includes the main portion 47 and the right-angular portion 48. The main portion 47 is offset as shown in Figures 1 and 2 sufficiently to permit such pivoting of the arm to the frame plate 18 while bringing the body of the arm into location in front of the index plate. This main portion 47 is also provided with the enlarged slot 49 which receives the shaft 16**, such slot being of sufficient length and so placed that the arm can execute all the needed swinging movements required for the corrections of tuning to be shown hereinafter.

To the outer end (free end) of the portion 48 there is anchored one end of a stiff leaf spring 50. The other (free) end of this spring is provided with the roller holder 51 which includes the spaced ears 52 and 53 (see Figures 1, 2 and 3), and the roller 54 is journalled in these ears for free rotation. This roller is of such size that it will seat into each of the notches of the index plate as such plate is rotated, thus semi-locking such index plate at the position dictated by such roller, but nevertheless the index plate may be forced past such semi-locking position by application of an increased rotative force to the shaft 16. As the knob is turned, and the shaft rotated in either direction the notches of the index plate will successively engage the roller (which is assumed to remain stationary during this operation), and each such engagement will produce a momentary increase of resistance to rotation which will be readily felt by the operator. These several notches are so located in the index plate that they correspond to approximate tuning positions of the shaft and the rotor elements carried thereby for the several frequencies to be tuned. Therefore, as each notch is engaged with the roller an approximate tuning position has been attained, and the increased resistance to rotation produced by the engagement of the roller with a notch indicates to the operator that the approximate tuning has been accomplished, and that exact tuning may then be produced.

Located on the shaft 16 between the index plate 30 and the knob 28a there is a short tube or concentric shaft 55. This tube carries the knob 56 by which it may be rotated for exact tuning. The rear end of this tube has secured thereto an eccentric block 57; and the flanges 58 and 59 are rigidly or securely carried by the portion 47 of the arm 45. These flanges are spaced to receive the ecentric block with a snug fit so that rotation of the tube and eccentric block will rock the arm 45 on its pivot point 46. Evidently rocking of the knob 56 will effect swing of the arm member 45 either up or down as the case may be. Such swing will carry with it the roller 54, and due to the engagement of such roller with one of the index plate notches, the index plate will also be rocked in the same direction. This will rock the shaft 16 and effect tuning correction. By making the eccentricity of the block 57 of relatively small amount it is possible to secure very fine corrective tuning movements with knob movements of appreciable size, and thus to effect close tuning.

It will also be noted that when it is desired to tune to some other station or channel it is only necessary to again rock the knob 28a whereupon the shaft 16 will be directly rotated, the roller being forced out of the notch with which it was previously engaged, and coming into engagement with the notch corresponding to the new station or channel which is desired. When this new notch has become engaged with the roller for approximate tuning of this new station, exact tuning may be effected by use of the knob 56 in manner already explained.

As a matter of convenience in construction the flanges 58 and 59 are formed from a blank of relatively thin and slightly springy metal. This blank is formed with the end portions 60 and 61 the end portions of which are bent over and embrace the arm 47 of the element 47. By this means the flanges 58 and 59 may be made to embrace the eccentric block under a slight spring pressure, so that good engagement between the parts is assured at all times. Furthermore, such slight flexibility of the flanges will ensure good engagement between the parts even when slight wear has occurred.

We claim:

1. In a tuner for tuning to a selected frequency of a plurality of radio frequencies, the combination of a movable frequency tuning element movable to various positions to tune corresponding frequencies, means to move said element for tuning purposes, an index plate movable harmoniously with said movable element, irregularities carried by said index plate corresponding to various frequencies to be tuned, means to engage said irregularities under yieldable pressure, and manual means to move said engaging means while engaged with a selected irregularity of the index plate for correction tuning purposes, substantially as described.

2. Means as defined in claim 1 wherein said irregularities of the index plate comprise notches therein, substantially as described.

3. Means as defined in claim 2, wherein said yieldable means comprises a spring pressed roller, substantially as described.

4. Means as defined in claim 1 wherein said movable tuning element is rotatable about an axis of rotation, and wherein said index plate is circular, substantially as described.

5. Means as defined in claim 4 wherein said irregularities comprise notches in the periphery of the index plate, substantially as described.

6. Means as defined in claim 5 wherein said yieldable means comprises a spring pressed roller, substantially as described.

7. In a tuner for tuning to a selected frequency of a plurality of radio frequencies, the combination of a rotatable frequency tuning element movable to various angular positions to tune corresponding frequencies, means to rotate said element for tuning purposes, a circular index plate rotatable harmoniously with said rotatable tuning element, notches in the peripheral portion of said index plate corresponding in position to various frequencies to be tuned, a movable correction element movable angularly within a plane substantially parallel to the plane of the index plate, means to move said element for correction purposes, a roller adapted to engage the notches of the index plate, and a spring connection between said movable correction element and said roller, substantially as described.

8. Means as defined in claim 7 wherein said spring connection comprises a leaf spring anchored to said movable correction element and a connection between the free end of said leaf spring and said roller, substantially as described.

9. In a tuner for tuning to a selected frequency of a plurality of radio frequencies, the combination of a movable frequency tuning element movable to various positions to tune corresponding frequencies, means to move said element for tuning purposes, an element connected to said movable frequency tuning element and movable therewith, an arresting element in engagement with said last specified element and arrestingly engaging said element at positions corresponding to various frequencies to be tuned, together with manual means to move said arresting element while so engaged with the said element to thereby move said element and the movable frequency tuning element for correction purposes, substantially as described.

10. Means as defined in claim 9 wherein said arresting element comprises a spring pressed element releasably engaging the element with which it engages, to thereby permit movement of the said engaged element to position for tuning different frequencies, substantially as described.

11. A tuning drive mechanism for radio receivers and the like comprising in combination, a movable tuning control means, a main tuning drive shaft for moving said means, a member movable with said main tuning drive shaft, a series of stops carried by said member, each adapted to represent a predetermined broadcast frequency channel, a means for selecting said stops successively, and a vernier control means for tuning within said channels connected to said stops for mechanically moving said main tuning drive shaft.

12. A tuning drive mechanism for radio receivers and the like comprising in combination, movable tuning control means, a main tuning drive shaft for moving said tuning control means, a disk member rotatable with said main tuning drive shaft, a series of stops carried by and spaced along an arcuate path on said disk member, movable means in the arcuate path of said stops for selecting and holding said stops successively to provide tuning adjustment of said tuning control means to each of a series of predetermined frequency bands, and vernier control means connected with said last named means for effecting limited movement thereof along said arcuate path for vernier tuning adjustment of said tuning control means within said channels.

13. In a tuner for tuning to a selected frequency of a plurality of radio frequencies, the combination of a movable frequency tuning element movable to various positions to tune corresponding frequencies, an index plate movable harmoniously with said movable element, irregularities carried by said index plate corresponding to various frequencies to be tuned, means to engage said irregularities under yieldable pressure, a manual means to move said engaging means while engaged with a selected irregularity of the index plate for correction tuning purposes, substantially as described.

CHESTER W. LYTLE.
FRANK NIENABER.

REFERENCES CITED

The following references are of record in the file of this patent:

UNITED STATES PATENTS

| Number | Name | Date |
|---|---|---|
| 2,424,291 | Stoddart | July 22, 1947 |